(12) United States Patent
Dong et al.

(10) Patent No.: US 8,618,857 B2
(45) Date of Patent: Dec. 31, 2013

(54) DELAY CIRCUIT AND ASSOCIATED METHOD

(75) Inventors: Yan Dong, San Jose, CA (US); Peng Xu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 42 days.

(21) Appl. No.: 13/431,595

(22) Filed: Mar. 27, 2012

(65) Prior Publication Data

US 2013/0257502 A1    Oct. 3, 2013

(51) Int. Cl.
*H03H 11/26* (2006.01)

(52) U.S. Cl.
USPC .................. 327/263; 327/262; 327/276

(58) Field of Classification Search
USPC .................................................. 327/262, 263
See application file for complete search history.

(56) References Cited

U.S. PATENT DOCUMENTS

| | | | | |
|---|---|---|---|---|
| 4,122,360 A * | 10/1978 | Kawagai et al. | ................ | 326/98 |
| 4,475,050 A * | 10/1984 | Noufer | ............................ | 326/71 |
| 4,578,600 A * | 3/1986 | Magee | ............................ | 326/34 |
| 4,791,321 A * | 12/1988 | Tanaka et al. | ................... | 326/27 |
| 4,806,801 A * | 2/1989 | Argade et al. | ................... | 326/71 |
| 4,827,159 A * | 5/1989 | Naganuma | ...................... | 326/27 |
| 4,943,745 A * | 7/1990 | Watanabe et al. | ............. | 327/262 |
| 4,945,262 A * | 7/1990 | Piasecki | .......................... | 326/68 |
| 5,117,131 A * | 5/1992 | Ochi et al. | ...................... | 326/71 |
| 5,216,293 A * | 6/1993 | Sei et al. | ......................... | 326/27 |
| 5,276,365 A * | 1/1994 | Maekawa | ......................... | 326/63 |
| 5,543,734 A * | 8/1996 | Volk et al. | ...................... | 326/83 |
| 5,583,460 A * | 12/1996 | Dohi et al. | ..................... | 327/126 |
| 5,600,274 A * | 2/1997 | Houston | ...................... | 327/262 |
| 5,682,113 A * | 10/1997 | Park et al. | ..................... | 327/174 |
| 6,016,070 A * | 1/2000 | Uehara | .......................... | 327/176 |
| 6,765,432 B2 * | 7/2004 | Mitsui | ........................... | 327/544 |
| 6,958,641 B2 * | 10/2005 | Lee | ................................. | 327/261 |
| 7,961,013 B2 * | 6/2011 | Yamada | ........................ | 327/108 |
| 8,054,111 B2 * | 11/2011 | Osame et al. | .................. | 327/112 |
| 8,179,170 B2 * | 5/2012 | Osame et al. | .................. | 327/112 |
| 2002/0135413 A1 * | 9/2002 | Tomaiuolo et al. | ........... | 327/263 |
| 2004/0217794 A1 * | 11/2004 | Strysko | ......................... | 327/263 |

* cited by examiner

*Primary Examiner* — Ryan Jager
(74) *Attorney, Agent, or Firm* — Perkins Coie LLP (57) ABSTRACT

The embodiments of the present invention disclose a delay circuit. The delay circuit comprises an inverter, a load capacitor, and a first voltage clamping module, wherein the first voltage clamping module generates a voltage drop configured to prolong the propagation delay time of the delay circuit as the power supply voltage decreases. The power supply dependent delay circuit may have a much larger propagation delay time at low power supply voltage than it at high power supply voltage at the rising-edge or falling-edge of an input signal.

9 Claims, 10 Drawing Sheets

DELAY CIRCUIT AND ASSOCIATED METHOD

TECHNICAL FIELD

The present invention generally relates to circuits placed within a signal path for compensating a delay difference with another signal path, and more particularly but not exclusively relates to delay circuits that have a drastic delay difference at different power supply voltages.

BACKGROUND

Figure 1:
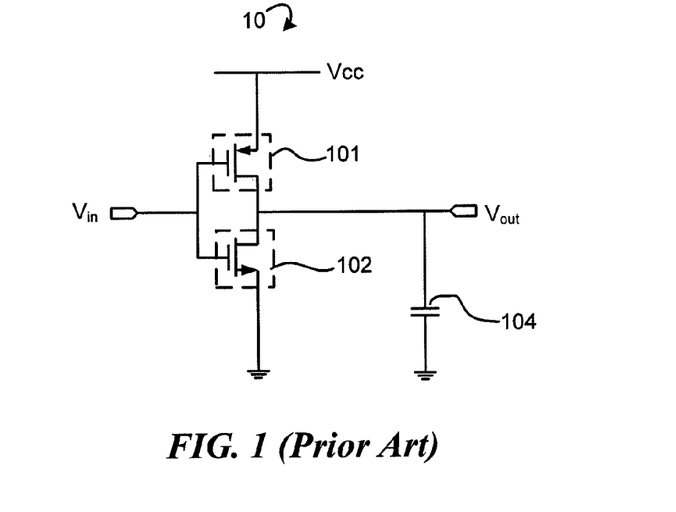
FIG. 1 illustrates a schematic circuitry of a CMOS inverter delay cell 10 as a prior art.

Time delay circuits are widely utilized in semiconductor applications. Conventionally, a delay circuit may be based on a complementary metal oxide semiconductor (CMOS) inverter cell 10 as shown in FIG. 1. When the CMOS inverter is operating, a P-type metal oxide semiconductor field effect transistor (MOSFET) 101 or an N-type MOSFET 102 with a load capacitor 104 may comprise a resistor-capacitor loop which has a propagation delay time, and thereby the input signal is delayed. Generally, the delay time of CMOS inverter 10 is not drastically affected by the system power supply voltage $V_{cc}$.

However, in certain applications, it is required that the delay time varies with the change of $V_{cc}$, thus providing a high power supply rejection ratio for the system. For example, in a synchronous buck controller or converter system, the dead-time of the buck converter increases as $V_{cc}$ voltage decreases. The reason is that when $V_{cc}$ reduces, the propagation delay of the adaptive gate driving circuitry increases. Thus a delay circuit with drastically different delay time at low $V_{cc}$ from that at high $V_{cc}$ is desired to compensate the system and to optimize the dead-time of the converter system. Although a digitally controlled delay circuit with feedback loop may be utilized to meet the requirement, it also has drawbacks such as high cost, complicated structure and large area occupation.

SUMMARY

A delay circuit for delaying a signal is disclosed hereby, wherein the delay time is prolonged significantly as a power supply voltage decreases. On the rising-edge or the falling-edge of an input signal, at a relative high power supply voltage, i.e., 6.0V or higher, the delay circuit has a relative small delay, whereas at a relative low power supply voltage, i.e., 2.7V or lower, the delay circuit has a relative large delay. In one embodiment, the delay circuit comprises: an inverter an inverter, which has an input end, an output end, and power supply end and a ground end, wherein the input end is coupled to an input signal and wherein the output end is configured to provide an output signal; a load capacitor which is coupled between the output end of the inverter and the reference ground; a first voltage clamping module, coupled between the power supply voltage and the power supply end of the inverter, or coupled between the ground end of the inverter and the reference ground, wherein the first voltage clamping generates a voltage drop when a current flows through the first voltage clamping module configured to prolong the delay time of the delay circuit as the power supply voltage decreases.

In certain embodiments, the disclosed delay circuit may be applied to a system, wherein the system has a first signal path and a second signal path. On the rising-edge or falling-edge of the signal on the first signal path, it has a delay which is changed significantly with the power supply voltage. For synchronizing the signals on the two signal paths, the disclosed delay circuit is added into the second signal path to prolong the delay when the power supply voltage decreases.

Other forms, features, and aspects of the above-described circuit, system or methods are described in the detailed specification that follows.

BRIEF DESCRIPTION OF THE DRAWINGS

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present technology may be practiced without these specific details. In other instances, well-known methods, procedures, components, and circuits have not been described in detail so as not to unnecessarily obscure aspects of the present invention.

Figure 2:
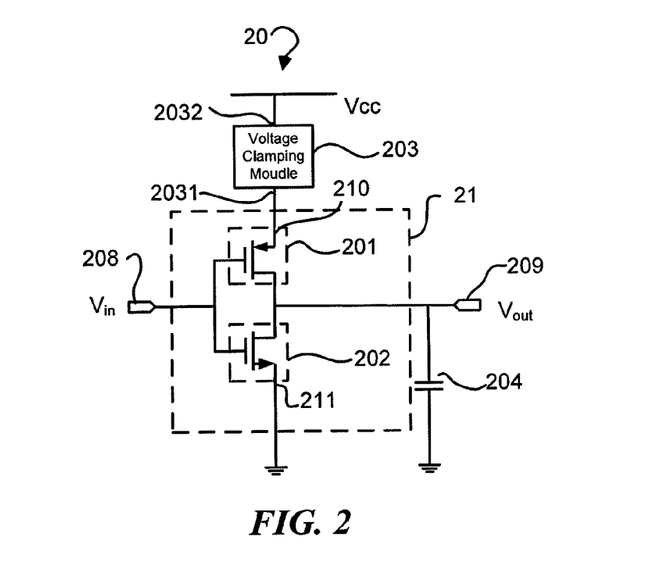
FIG. 2 illustrates a schematic circuitry of a smart delay cell 20 according to an embodiment of the present invention.

FIG. 2 illustrates a schematic circuitry of a smart delay cell 20 according to an embodiment of the present invention. Referring to FIG. 2, the smart delay cell 20 comprises an inverter 21, wherein the inverter 21 has an input end 208, an output end 209, a power supply end 210, and a ground end 211. In the illustrated embodiment shown in FIG. 2, the inverter 21 is a complementary metal oxide semiconductor (CMOS) inverter, which comprises a P-type metal oxide semiconductor field effect transistor (PMOS) 201 and an N-type metal oxide semiconductor field effect transistor (NMOS) 202. Input end 208 is coupled to gates of the PMOS 201 and NMOS 202 to introduce an input signal $V_{in}$. Output end 209 is coupled to drains of the PMOS 201 and NMOS 202 to provide a delayed output signal $V_{out}$. Output end 209 is further coupled to a load capacitor 204. In one embodiment, the load capacitor 204 represents the parasitic capacitance of CMOS inverter 21. In other embodiments, load capacitor 204 may further comprise other types of capacitance. The source terminal of the NMOS 202 serves as ground end 211 of the inverter 21, which is connected to a reference ground. In one embodiment, the reference ground is a system ground. As shown in FIG. 2, smart delay cell 20 further comprises a voltage clamping module 203. A first end 2031 of voltage clamping module 203 is coupled to the power supply end 210 of the inverter 21 and a second end 2032 of voltage clamping module 203 is coupled to the power supply voltage $V_{cc}$. Wherein the source terminal of the PMOS 201 serves as the power supply end 210. Voltage clamping module 203 generates a voltage drop $V_R$ when a current flows through. In one embodiment, the voltage drop $V_R$ is at least substantial a constant value.

The input signal is inverted and delayed by the inverter 21. With the voltage drop effect from voltage clamping module 203, when the power supply voltage decrease, the delay time of smart delay cell 20 at the falling-edge of the input signal $V_{in}$ may be dynamically prolonged. The specific structure and function of clamping module 203 will be discussed in the following text.

Figure 3:
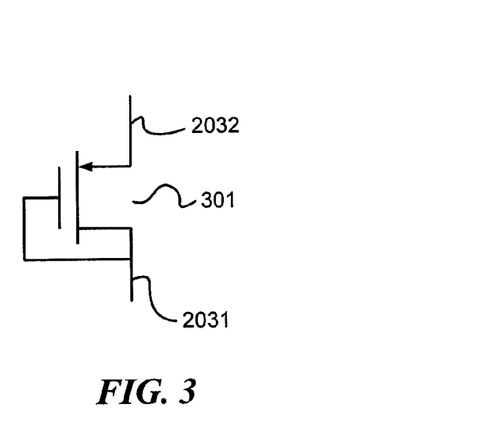
FIG. 3 illustrates a specific circuitry of voltage clamping module 203 according to an embodiment of the present invention.

FIG. 3 illustrates a specific circuitry of voltage clamping module 203 according to an embodiment of the present invention. In the illustrated embodiment, voltage clamping module 203 comprises a diode-connected PMOS 301. In other words, the drain terminal and the gate terminal of PMOS 301 are coupled together to comprise first end 2031. The source terminal of PMOS 301 comprises second end 2032.

Figure 4A:
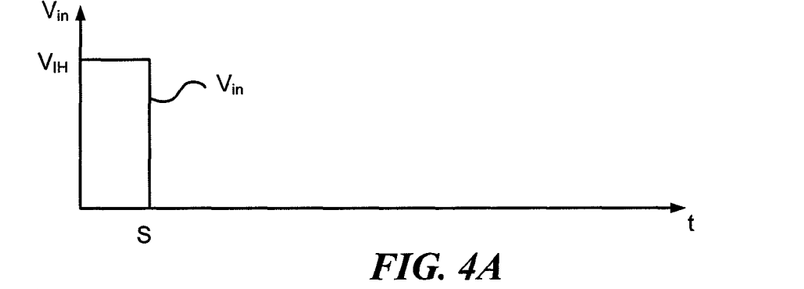
FIG. 4A-4C illustrates a step-input response waveform diagram of the smart delay cell 20 at different power supply voltage according to an embodiment of the present invention.
Figure 4B:
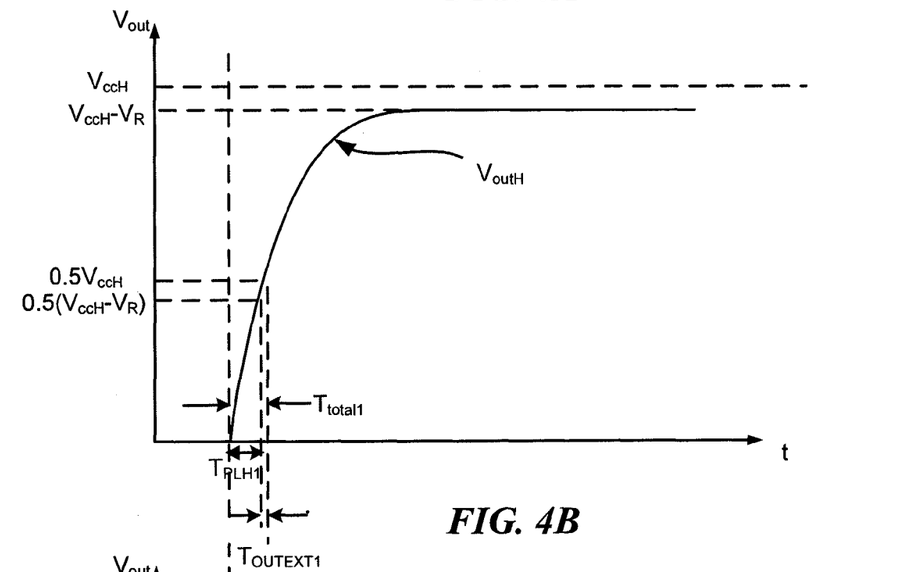
Figure 4C:
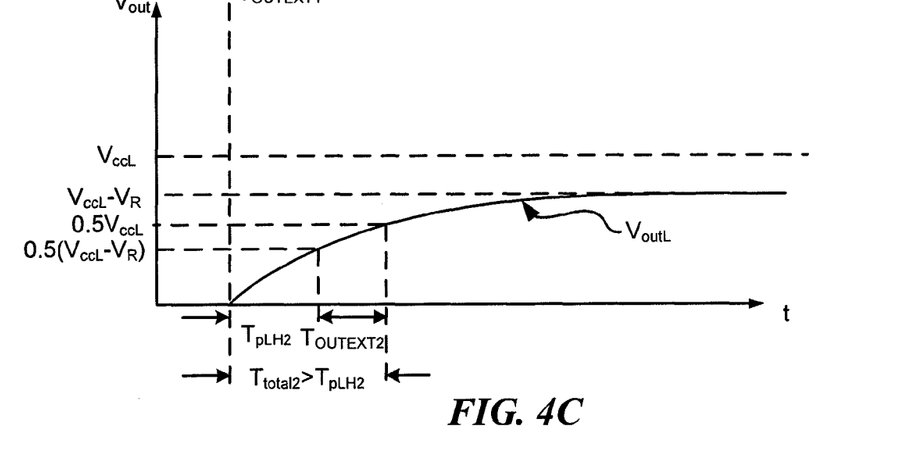

FIG. 4A-4C illustrates an idealized low-to-high (falling-edge of input signal $V_{in}$) transient response waveform diagram of the smart delay cell 20 at different power supply voltage according to an embodiment of the present invention. For better understanding, it is defined that $V_{IH}$ is the logic high value of the input signal $V_{in}$, and $V_{OH}$ is the logic high value of the output signal $V_{out}$. At a relatively low power supply voltage $V_{ccL}$ (e.g. 2.7V), the output signal of smart delay cell 20 is labeled as $V_{outL}$ in FIG. 4C, while at a relatively high power supply voltage $V_{ccH}$ (e.g. 6.0V), the output signal of smart delay cell 20 is labeled as $V_{outH}$ in FIG. 4B. In the following analysis, it is assumed that $V_{IH}=V_{cc}$. Generally, the low-to-high total delay time $T_{total}$ is the period from the moment when the input signal reaches $$\frac{V_{IH}}{2}$$

to the moment when the output signal reaches $$\frac{V_{cc}}{2}.$$

Hereby it is simplified that the output signal $V_{out}$ starts to rise at the moment when the input signal $V_{in}$ reaches $$\frac{V_{OH}}{2}.$$

So $T_{total}=T_{INEXT}+T_{pLH}+T_{OUTEXT}$, wherein $T_{INEXT}$ is defined as the external input delay time which represents the time for the input signal to transition from $$\frac{V_{IH}}{2} \text{ to } \frac{V_{OH}}{2}.$$

The low to high propagation delay $T_{pLH}$ is defined as the time period when the output signal rises from 0 (the moment when the input signal reaches $$\left(\text{the moment when the input signal reaches } \frac{V_{OH}}{2}\right) \text{ to } \frac{V_{OH}}{2}$$

for the rising-edge of the output signal. $T_{OUTEXT}$ is defined as external output delay time which represents the time for the output signal to transition from $$\frac{V_{OH}}{2} \text{ to } \frac{V_{cc}}{2}.$$

Referring in FIG. 4A, at a moment S, the input signal $V_{in}$ immediately jumps from $V_{IH}$ to 0. Therefore $T_{INEXT}$ can be ignored. PMOS 201 turns on and NMOS 202 turns off. Load capacitor 204 and the on-state PMOS 201 comprise a $1^{st}$-order resistance-capacitor (RC) network. The power supply voltage $V_{cc}$ starts to charge the load capacitor 204. When the smart delay cell 20 is operating, the voltage level at the source terminal of PMOS 201 is maintained at $V_{cc}$-$V_R$. The delayed output signal $V_{out}$ is:

$$V_{out} = (V_{cc} - V_R)\left(1 - e^{-\frac{t}{\tau}}\right) \quad (1)$$

$$\tau = R_{PMOS} \times C_L \quad (2)$$

In above formulas, $R_{PMOS}$ is the on-state resistance of PMOS 201, and $C_L$ is the capacitance of the load capacitor 204. Generally, it is assumed that PMOS 201 is in the constant-current region throughout this transition. According to formula (I), $T_{pLH}$ should be $$T_{pLH} = 0.69\tau \approx 0.69 \frac{C_L}{K(V_{cc} - V_R - V_{TP})} \quad (3)$$

$$K = \mu_p C_{OX} \frac{W_{PMOS}}{L_{PMOS}} \quad (4)$$

wherein $V_{TP}$ is the threshold voltage of PMOS 201. K is the conductivity factor of PMOS 201. $\mu_p$ is carrier mobility of PMOS 201. $C_{ox}$ is the gate oxide capacitor per unit area of PMOS 201. $L_{PMOS}$ and $W_{PMOS}$ are gate length and gate width of PMOS 201 respectively.

Seen in FIG. 4B, when $V_{cc}$ is at the relatively high voltage $V_{ccH}$, $V_{ccH} \gg V_R$, and $V_{ccH} \gg V_{TP}$. As a result, the $V_R$ and $V_{TP}$ may be ignored. according to formula (3), $$T_{pLH1} = 0.69 \frac{C_L}{K(V_{ccH} - V_R - V_{TP})} \approx 0.69 \frac{C_L}{KV_{ccH}}.$$

However in FIG. 4C, when $V_{cc}$ is at the relatively low voltage $V_{ccL}$ (e.g. 2.7V), $V_{cc} \approx V_R + V_{TP}$. Therefore $V_R$ and $V_{TP}$ could not be ignored, and the low-to-high propagation delay time $$T_{pLH2} = 0.69 \frac{C_L}{K(V_{ccL} - V_R - V_{TP})}.$$

As a result, $T_{pLH1} \ll T_{pLH2}$, the low-to-high propagation delay time of the smart delay cell 20 at a relatively low power supply voltage may be much larger than that at a relatively high power supply voltage.

In addition, the total delay time may further comprise $T_{OUTEXT}$ which is defined as external output delay time which represents the time for the output signal to transition from $$\frac{V_{OH}}{2} \text{ to } \frac{V_{cc}}{2}$$

as described in the above text. When $V_{cc}$ is at the relatively high voltage $V_{ccH}$, $V_{OH} = V_{ccH} - V_R \approx V_{ccH}$. $T_{OUTEXT1}$ is a very short time period that can be ignored. While when $V_{cc}$ is at the relatively low voltage $V_{ccL}$, $V_{OH} = V_{ccL} - V_R < V_{ccL}$. Therefore $T_{OUTEXT2}$ is a relatively long period.

As $T_{pLH1} + T_{OUTEXT1} \ll T_{pLH2} + T_{OUTEXT2}$, the total delay time for smart delay cell 20 at a relatively low power supply voltage is much larger than that at a relatively high power supply voltage.

In certain embodiments, due to the application requirement, the delay difference between $T_{pLH1}$ and $T_{pLH2}$ may be specifically designed. Referring in formula (3) and (4), the delay time difference between $T_{pLH1}$ and $T_{pLH2}$ is related to the conductivity factor K. The conductivity factor K is adjustable by changing the gate width W of PMOS 201 $W_{PMOS}$. Therefore the delay difference between $T_{pLH1}$ and $T_{pLH2}$ may be decided by the value of $W_{PMOS}$.

Figure 5A:
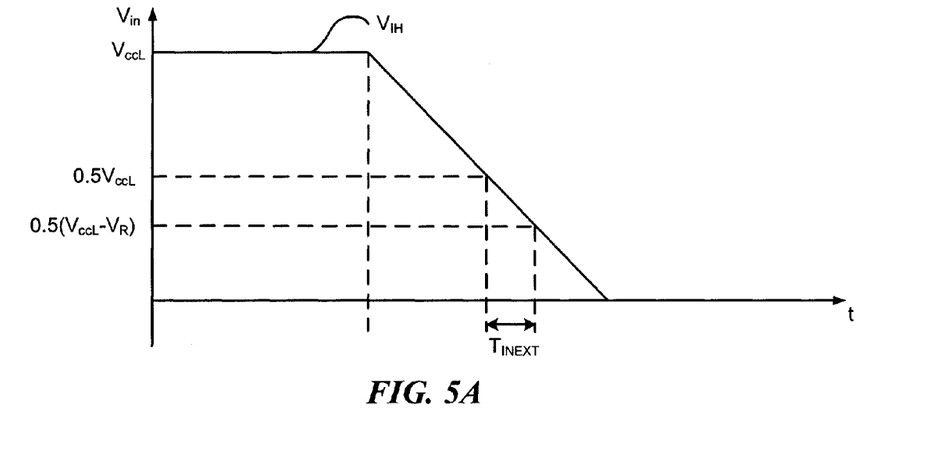
FIG. 5A-5B illustrates a schematic waveform diagram of a propagation delay time comparison at a low power supply voltage between the CMOS inverter delay cell 10 and smart delay cell 20 according to an embodiment of the present invention.
Figure 5B:
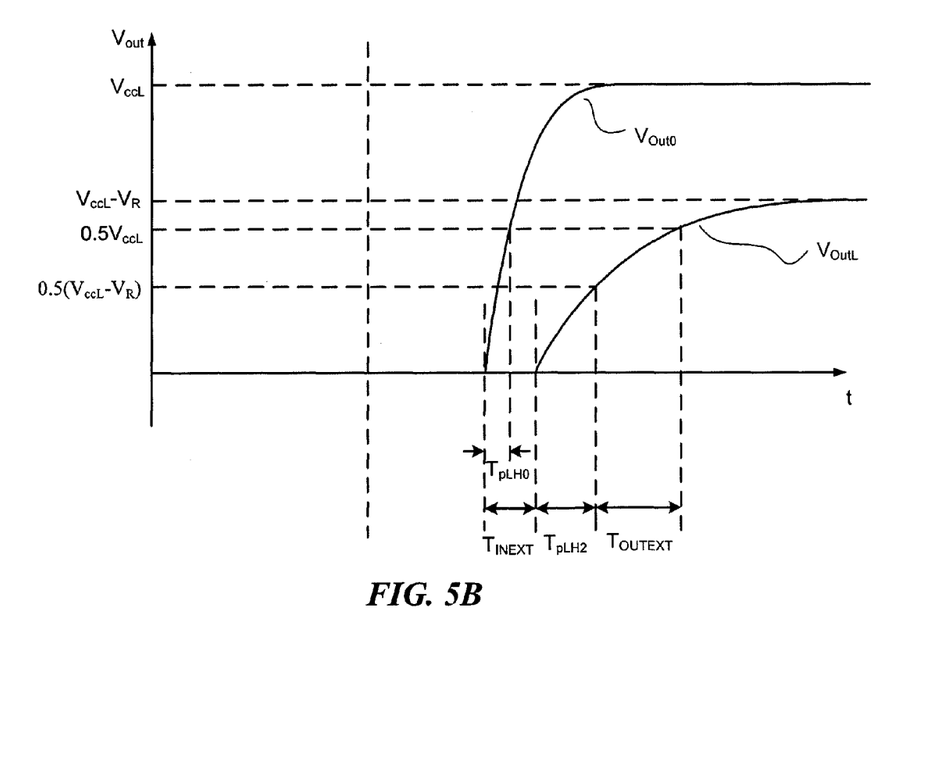

FIG. 5A-5B illustrates a schematic waveform diagram of a realistic low-to-high total delay time comparison between the CMOS inverter delay cell 10 and the smart delay cell 20 at the low power supply voltage $V_{ccL}$. Seen in FIG. 5A, the input signal $V_{in}$ is changed gradually. Referring to FIG. 5B, An output signal of CMOS inverter delay cell 10 is labeled as $V_{out0}$. For the CMOS inverter delay cell 10, despite the power supply voltage, $V_{OH} = V_{IH} = V_{cc}$. Therefore, the external input delay time $T_{INEXT0}$ and the external output delay time $T_{OUTEXT0}$ for CMOS inverter delay cell 10 can be ignored. Whereas for smart delay cell 20, $V_{OH} = V_{cc} - V_R$. According to previous analysis, when $V_{cc}$ is at the relatively high value $V_{ccH}$ (e.g. 6.0V, not shown in FIG. 5), $$\frac{V_{cc} - V_R}{2} \approx \frac{V_{cc}}{2}$$

(not shown in FIG. 5B). The external input delay time $T_{INEXT1}$ and the external output delay time $T_{OUTEXT1}$ are short enough and thus also may be ignored. However, when the $V_{cc}$ is at the relatively low value $V_{ccL}$, $V_R$ could not be ignored. As $V_{OH} = V_{ccL} - V_R < V_{ccL}$, and $V_{IH} = V_{ccL} - V_R < V_{ccL}$, the external input delay time $T_{INEXT2}$ and the external output delay time $T_{OUTEXT2}$ are relatively long. Thus $T_{INEXT2} + T_{OUTEXT2} > T_{INEXT0} + T_{OUTEXT0}$.

Moreover, for CMOS inverter delay cell 10, the propagation delay time $$T_{pLH0} = 0.69 \frac{C_L}{KV_{cc}}$$

according to formula (3), which nearly equals to the propagation delay time of smart delay cell 20 with high power supply voltage as mentioned above. While the propagation delay of smart delay cell 20 with low power supply voltage is $$T_{pLH2} = 0.69 \frac{C_L}{K(V_{ccL} - V_R - V_{TP})}.$$

Consequently, when the power supply voltage is relatively low, the propagation delay time of smart delay cell 20 is much longer than it of CMOS inverter delay cell 10. $T_{pLH2} > T_{pLH0}$ In sum, at a relatively low power supply voltage, the total delay time $$T_{total0} = T_{pLH0} < T_{INEXT2} + T_{pLH2} + T_{OUTEXT} = T_{total2}$$

Wherein $T_{total0}$ is the total delay time of CMOS inverter delay cell 10 and $T_{total2}$ is the total delay time of smart delay cell 20. It is indicated that at the occasion of relatively low power supply voltage, the total delay time $T_{total2}$ of smart delay cell 20 becomes much larger than $T_{total0}$ of CMOS inverter delay cell 10. Generally, at the relatively low power supply voltage $V_{ccL}$, $T_{total2}$ is at least 2 times larger than $T_{total0}$. In certain embodiments, $T_{total2}$ may be 5-20 times larger than $T_{total0}$.

When the input signal $V_{in}$ of smart delay cell 20 is at falling-edge, PMOS 201 turns off and NMOS 202 turns on. The charged load capacitor 204 is conducted to the reference ground through NMOS 202 which is the same as the transition of the CMOS inverter delay cell 10. Therefore, the high-to-low total delay time of smart delay cell 20 is neither obviously different from that of CMOS inverter delay cell 10 nor seriously affected by the power supply voltage.

Figure 6:
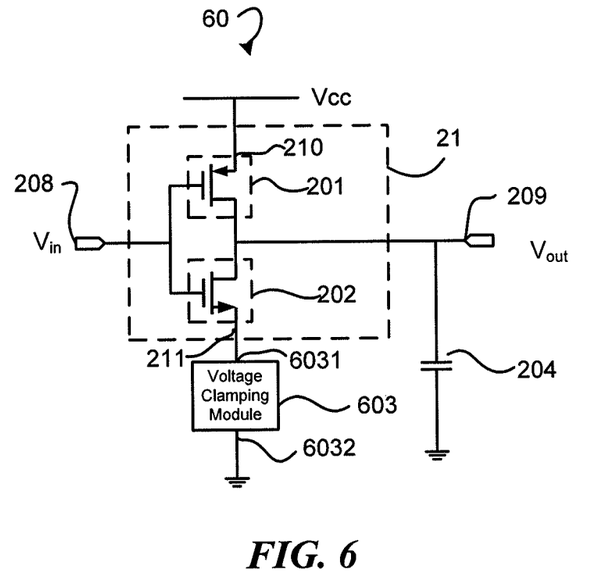
FIG. 6 illustrates a schematic circuitry of a smart delay cell 60 according to another embodiment of the present invention.

FIG. 6 illustrates a schematic circuitry of a smart delay cell 60 according to another embodiment of the present invention. Compared with the smart delay cell 20, the power supply end 210 of inverter 21 is directly connected to the system power supply voltage $V_{cc}$. Instead, the ground end 211 of inverter 21 is coupled to a first end 6031 of a voltage clamping module 603. A second end 6032 of voltage clamping module 603 is coupled to the reference ground.

Figure 7:
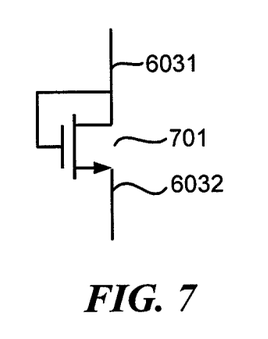
FIG. 7 illustrates a specific circuitry of voltage clamping module 603 according to an embodiment of the present invention.

In an embodiment of the present invention, voltage clamping module 503 may comprise a diode-connected NMOS 701 as shown in FIG. 7, wherein the gate terminal and the drain terminal are coupled together as the first end 6031, and the source terminal of NMOS 701 is applied as second end 6032. In another embodiment, voltage clamping module 603 may be the same structure as shown in FIG. 3. In yet another embodiment, the structure shown in FIG. 7 may be applied in the voltage clamping module 203.

However, one with ordinary skill in relevant art should understand that the structure of voltage clamping module 203 and 603 are not limited by the embodiments shown in FIG. 3 and FIG. 7. In other embodiments, other suitable circuit or device such as diode string, bipolar junction transistor (BJT), junction field effect transistor (JFET), metal semiconductor field effect transistor (MESFET) and so on may be applied in voltage clamping module 203 and 603.

Similar to the reasons analyzed in above text for smart delay cell 20, at a relatively low power supply voltage $V_{ccL}$, the high-to-low propagation delay time of smart delay cell 60 may be much larger than that at a relatively high power supply voltage $V_{ccH}$ and the high-to-low (falling-edge) total delay time of smart delay cell 60 may be much larger than that of inverter 10.

Figure 8:
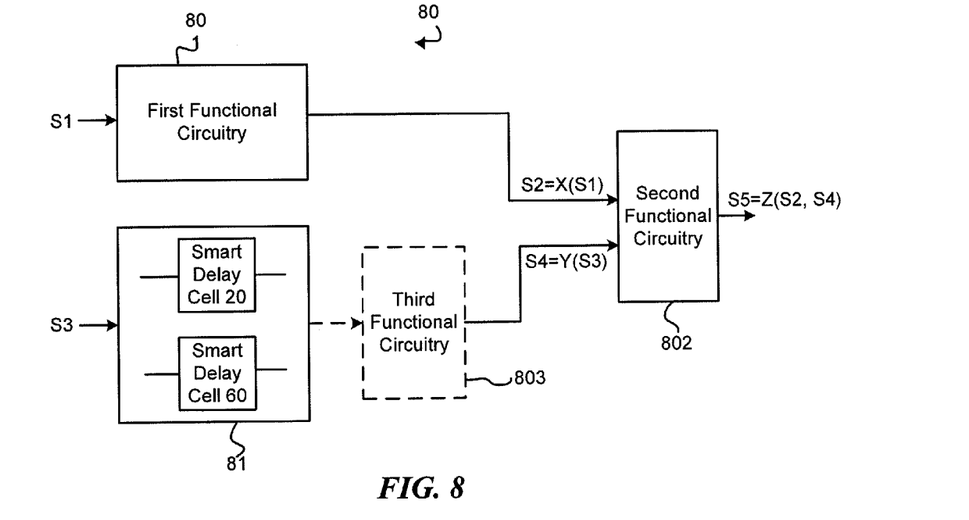
FIG. 8 illustrates a block diagram of a system 80 within a delay circuit 81 according to an embodiment of the present invention.

FIG. 8 illustrates a block diagram of a system 80 within a delay circuit 81 according to an embodiment of the present invention. Seen in FIG. 8, the system 80 comprises two signal paths. A first signal S1 traverses a first circuitry block 801 and is delayed for a first propagation delay time D1, which forms a first signal path. In one embodiment, first circuitry block 801 may be a functional circuit according to a function S2=X(S1). In another embodiment, first circuitry block 801 may further comprise a delay circuit. Some unexpected by effects may be brought into first circuitry block 801, for which the delay time D1 is drastically prolonged along with the decrease of the power supply voltage. Once it happens, the two signal paths may be non-synchronous. Continuing in FIG. 8, a second signal S3 traverses delay circuit 81 has and is delayed for a second propagation delay time D2, which forms a second signal path. Delay circuit 81 at least comprises a smart delay cell 20 or 60. In one embodiment, an optional third functional circuitry block 803 may further be coupled to the delay circuit 81 and generate a signal S4 according to a function S4=Y(S3). In another embodiment, delay circuit 81 directly generates a signal S4 according to the signal S3. Then signals S2 and S4 may be sent to a second functional block 802 and an output signal S5 is generated according to a function S5=Z(S2, S4). According to previous analysis, the propagation delay time of smart delay cell 20 or 60 is sensitive with the variation of power supply voltage at either the rising-edge or the falling-edge of the input signal. Therefore delay circuit 81 may prolong the second delay time D2 at either the rising-edge or the falling edge of the input signal when the power supply voltage decreases. As described above, the first delay time D1 may be prolonged because of the decrease of power supply voltage. Hereby, due to this delay feature of delay circuit 81, the second signal path may also be prolonged along with the decreases of the power supply voltage, which make signals S2 and S4 on the two signal paths be synchronous despite the power supply voltage. Thus system 80 is prevented from being affected by different power supply voltage and thus has a high power supply rejection ratio.

Figure 9A:
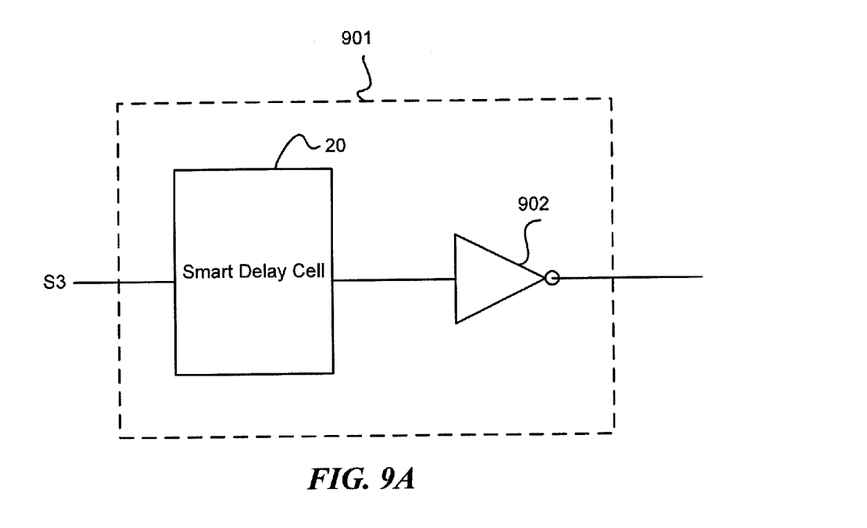
FIG. 9A illustrates a schematic circuitry of the delay circuit 81 according to an embodiment of the present invention.
Figure 9B:
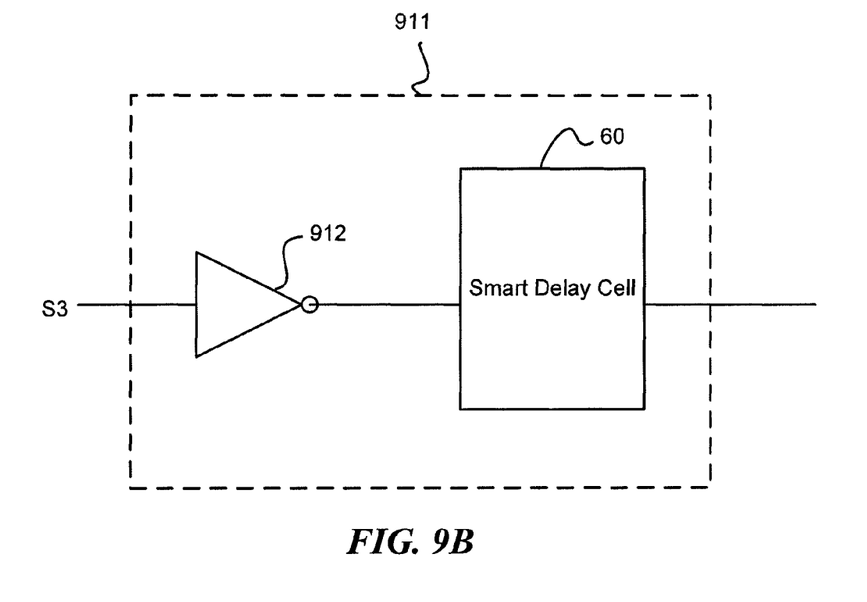
FIG. 9B illustrates a schematic circuitry of the delay circuit 81 according to another embodiment of the present invention.
Figure 9C:
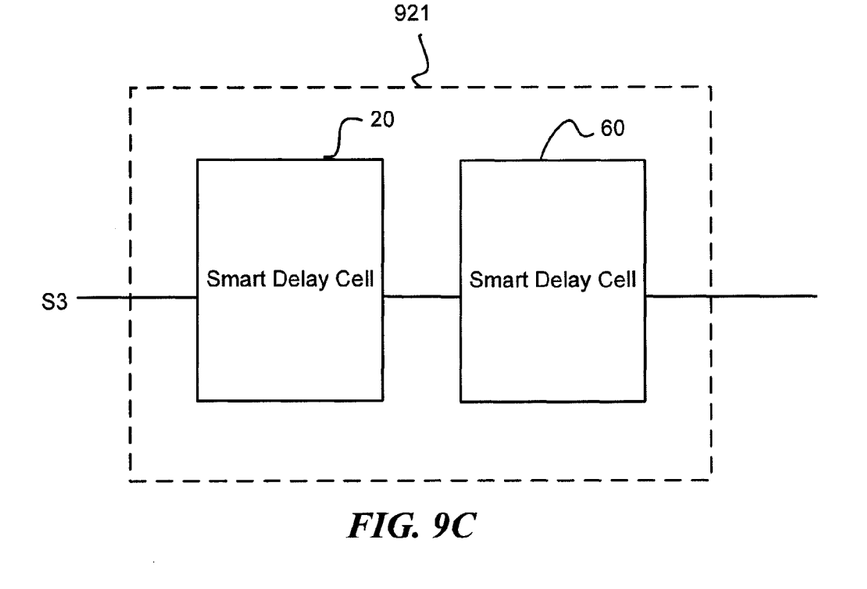
FIG. 9C illustrates a schematic circuitry of the delay circuit 81 according to yet another embodiment of the present invention.

FIG. 9A-9C illustrates several schematic circuitry of delay circuit 81 according to some embodiments of the present invention. For better understanding, it is assumed that the delay circuit 81 directly generates signal S4.

Seen in FIG. 9A, in an embodiment, delay circuit 81 may comprise at least one delay unit 901. A delay unit 901 may comprise a smart delay cell 20 and an inverter 902, wherein the input end 208 of smart delay cell 20 may be coupled to the second signal S3 and the output end 209 of smart delay cell 20 is coupled to an input end of inverter 902. An output end of inverter 902 is coupled to the input end of the optional second functional circuitry block 802 (if applied) or the input end of third functional circuitry block 803.

At the falling-edge of the second signal S3, once the power supply voltage decreases, the smart delay cell 20 may invert and delay the second signal S3 for a prolonged delay time configured to make the generated second signal S4 at the second signal path synchronous with the signal S2 at the first signal path. While the inverter 902 is responsible for inverting the output signal of smart delay cell 201. Thus the delay unit 901 generates a delayed copy of the second signal S3 as the signal S4.

Referring to FIG. 9B, in another embodiment of present invention, delay circuit 81 may have an alternative structure. As shown in FIG. 9B, delay circuit 81 may at least comprise a delay unit 911, wherein delay unit 911 may comprise an inverter 912 and a smart delay cell 60 series-coupled together. The second signal S3 is provided to the input end of inverter 912. The output end of smart delay cell 60 is coupled to the input end of the optional second functional circuitry block 802 (if applied) or the input end of third functional circuitry block 803.

At the falling-edge of the second signal S3, once the power supply voltage decreases, first the inverter 912 inverts the second signal S3. Then the smart delay cell 60 may invert and delay the inverted second signal S3 for a prolonged delay time configured to make the generated signal S4 at the second signal path synchronous with the signal S2 at the first signal path. Thus the delay unit 911 generates a delayed copy of the second signal S3 as the signal S4.

Turning to FIG. 9C, in yet another embodiment of the present invention, delay circuit 81 may at least comprise a delay unit 921, wherein delay unit 921 may comprise a smart delay cell 20 and a smart delay cell 60 series-coupled together. The second signal S3 is coupled to the input end of smart delay cell 20 and the output end of smart delay cell 60 is coupled to the input end of the optional second functional circuitry block 802 (if applied) or the input end of third functional circuitry block 803.

At the falling-edge of the second signal S3, once the power supply voltage decreases, the smart delay cell 20 may invert and delay the second signal S3 for a prolonged delay time. Then the smart delay cell 60 may further invert and delay the output signal of the smart delay cell 20 for a prolonged delay time. Thus the delay unit 921 generates a delayed copy of the second signal S3 as the signal S4 at the second signal path which is synchronous with the signal S2 at the first signal path One with ordinary skill in relevant art should note that in certain embodiments, delay circuit 81 may comprise two or more delay units, or the combination of delay units 901, 911 and/or 921.

Although the delay circuits 81 shown in FIG. 9A-9C are sensitive with the power supply voltage at falling-edge of the input signal, one with ordinary skill in relevant art should further understand that in other embodiments, delay circuit 81 may also be sensitive with the power supply voltage at rising-edge of the input signal by reversing the consequence of the components in the delay unit.

Figure 10:
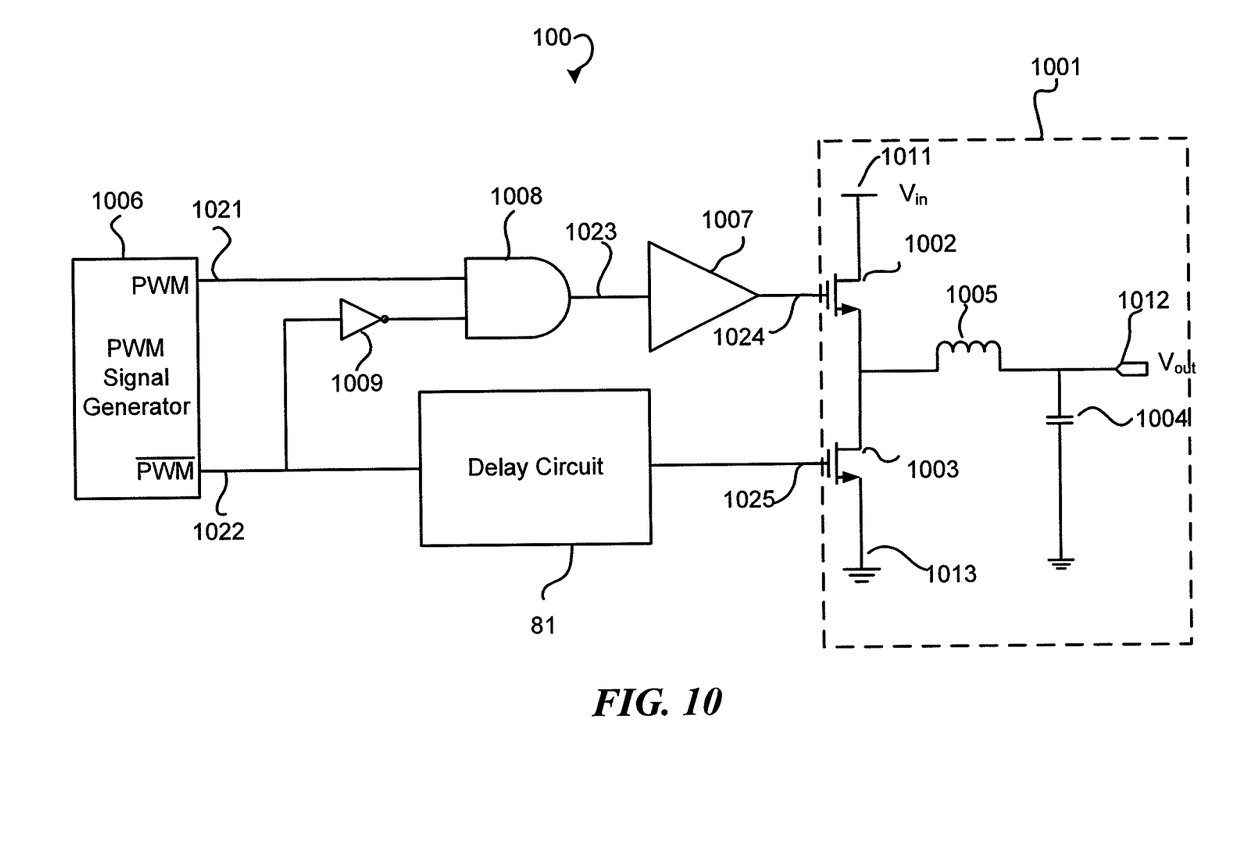
FIG. 10 illustrates a schematic circuitry of a voltage converter 100 with the delay circuit 81 according to an embodiment of the present invention.

FIG. 10 illustrates a specific schematic circuitry of a system 100 with a delay circuit 81 according to an embodiment of the present invention. As shown in FIG. 10, system 100 is a voltage converter system which comprises a switch converter 1001 as the third functional block, wherein the switch converter 1001 further comprises a primary switch 1002 and a synchronous rectifier 1003. Primary switch 1002 and synchronous rectifier 1003 are series coupled between an input voltage 1011 and the reference ground 1013. In other embodiments, according to other widely-known topologies, voltage converter system 100 may comprise two or more primary switches or synchronous rectifiers with different connection method. The switch converter 1001 may further comprise a filter inductor 1004 and a filter capacitor 1005, which are coupled to the common end of primary switch 801 and synchronous rectifier 1003 to provide an output voltage 1012 as the output signal S5. A pulse width modulation (PWM) signal generator 1006 generates a PWM control signal 1021 to a first signal path and a $\overline{PWM}$ signal 1022 to a second signal path respectively, wherein the $\overline{PWM}$ signal 1022 is the complementary signal of PWM control signal 1021. The first signal path comprises a voltage level shifter circuit 1007, an AND gate 1008 and an inverter 1009. $\overline{PWM}$ signal 1022 is inverted by inverter 1009 and then coupled to a first input end of AND gate 1008. PWM control signal 1021 is coupled to a second input end of AND gate 1008. An output end of AND gate 1008 generates an AND gate output signal 1023 as the first signal S1 to voltage level shifter circuit 1007. Voltage level shifter circuit 1007 serves as the first functional circuitry 801, configured to shift the voltage level of AND gate output signal 1023 to generate a high side signal 1024. As the signal S2, high side signal 1024 controls primary switch 1002. Voltage level shifter circuit 1007 further has a propagation delay which is sensitive to the power supply voltage. As the power supply voltage decreases, the propagation delay of voltage level shifter circuit 1007 is prolonged. Therefore a non-synchronous issue may occur between primary switch 1002 and synchronous rectifier 1003. To avoid such issue, the second signal path comprises a delay circuit 81. In certain embodiments, delay circuit 81 may comprise one or more delay units as shown in FIG. 9A-9C. $\overline{PWM}$ signal 1022 which is corresponding to the second signal S3 in FIG. 8 traverses delay circuit 81 at the second signal path. The delayed $\overline{PWM}$ signal 1022 is utilized as a low side gate signal 1025 which is corresponding to the signal S4 in FIG. 8, configured to control synchronous rectifier 1003.

Figure 11:
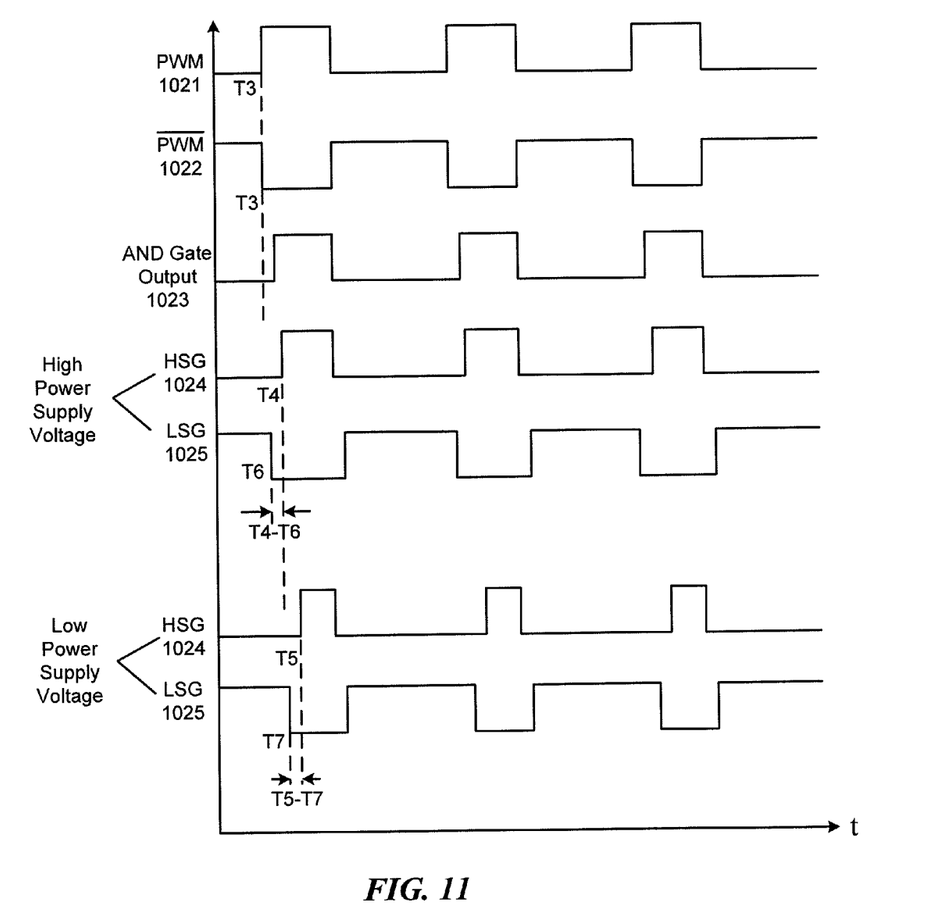
FIG. 11 illustrates a wave form diagram of voltage converter 100 according to an embodiment of the present invention.

FIG. 11 illustrates an operational wave form diagram of voltage converter system 100 according to an embodiment of the present invention. At time T3, the PWM signal 1021 shifts from low to high, and $\overline{PWM}$ signal 1022 shifts from high to low. However, since inverter 1009 also has a propagation delay time, AND gate 1008 still provides a low level output signal 1023 until inverter 1009 provides an inverse and delayed $\overline{PWM}$ signal 1022 to the first input end of AND gate 1008. Whereas when the PWM control signal 1021 shifts from high to low, the output signal 1023 of AND gate 1008 shifts from high to low immediately. Then the output signal of AND gate 1008 is coupled to voltage level shifter circuit 1007, and high side gate signal 1024 is generated. Once the power supply voltage of the voltage converter is at relatively high level ($V_{ccH}$), the voltage level shifter circuit 1007 has a relatively short propagation delay and high side gate signal 1024 begins to rise at time T4. While if the power supply voltage of the voltage converter system 100 is at relatively low level ($V_{ccL}$), the voltage level shifter circuit 1007 has a relatively long propagation delay at rising-edge of PWM signal 1021 and high side gate signal 1024 begins to rise at time T5.

To avoid non-synchronous issue between high side signal gate 1024 and low side gate signal 1025, $\overline{PWM}$ signal 1022 is also delayed by delay circuit 81. According to previous analysis, the propagation delay time of delay circuit 81 at falling-edge is relatively long at relatively low power supply voltage $V_{ccL}$ and relatively short at relatively high power supply voltage $V_{ccH}$ respectively. As a result, the low side gate signal 1025 begins to fall at time T6 for a relatively low power supply voltage $V_{ccL}$ and to fall at time T7 for a relatively high power supply voltage $V_{ccH}$. In one embodiment, T4−T6≈T5−T7, which means the dead-time of converter system 100 at rising-edge of PWM signal 1021 is nearly constant despite the power supply voltage.

Figure 12:
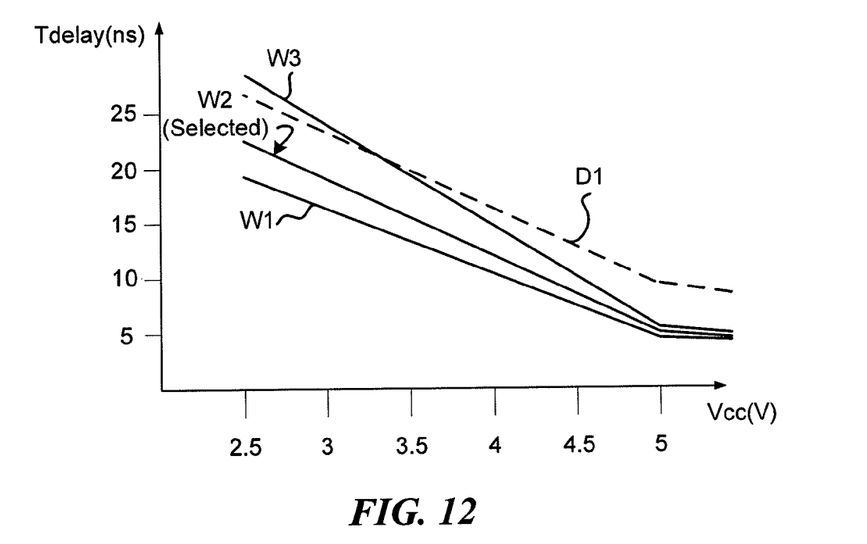
FIG. 12 illustrates a delay-time characteristic diagram of the two signal paths at voltage converter system 100 according to an embodiment of the present invention.

FIG. 12 illustrates a delay-time characteristic diagram of the two signal paths at voltage converter system 100 according to an embodiment of the present invention. As seen in FIG. 12, at the rising-edge of PWM signal 1021, when the power supply voltage is larger than 5V, the first propagation delay time D1 on the first signal path is substantially constant. However, when the power supply voltage is smaller than 5V, the total delay time D1 of the first signal path increases drastically as the power supply voltage decrease. When the power supply voltage is at 5V, the delay time D1 is near 10 ns. While when the power supply voltage is 2.7V, the first propagation delay time D1 increases to near 27 ns. For compensating for this occasion, the second propagation delay time D2 for delay circuit 81 is required to track the variation of the delay time D1 at different power supply voltage to make high side gate signal 1024 and low side gate signal 1025 be synchronous. As described above, by changing the gate width W of PMOS 201, the variation trend of delay time D2 verse power supply voltage may be regulated. Seen in FIG. 12, there are three delay-time characteristic curves which are corresponding to gate width W1, W2 and W3 of PMOS 201 respectively. The selected delay time D2 with gate width W2 has a delay time of near 5 ns at 5V, and a delay time of near 22 ns at 2.7V. Due to such delay characteristic, the value of D1-D2 keeps substantially constant as the power supply voltage varies.

Figure 13A:
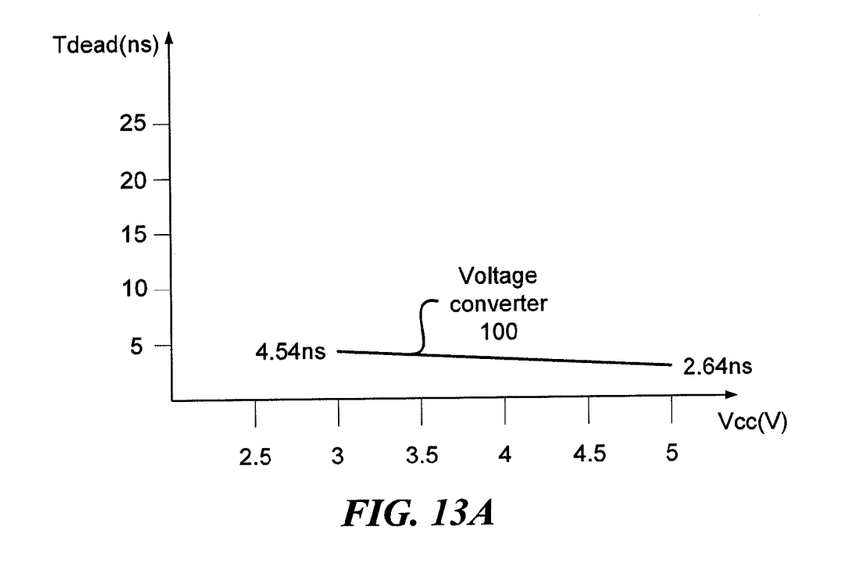
FIG. 13A illustrates an experimental dead-time characteristic diagram of the voltage converter 100 according to an embodiment of the present invention.
Figure 13B:
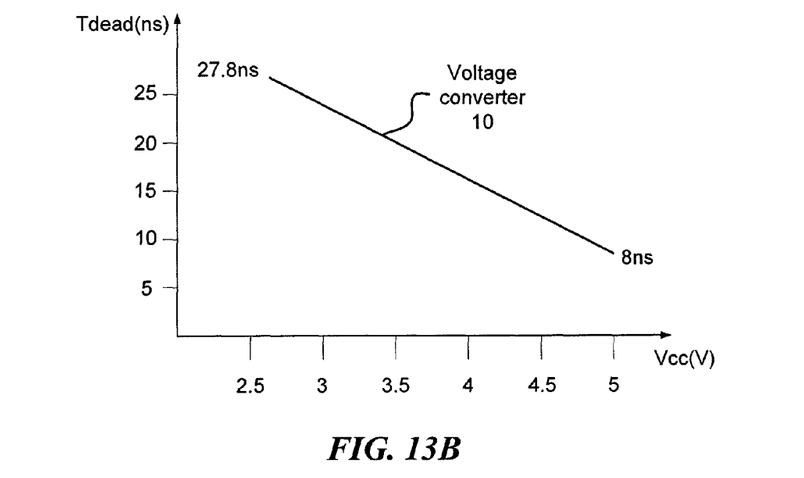
FIG. 13B illustrates an experimental dead-time characteristic diagram of the conventional voltage converter 10 according to a prior art

FIG. 13A illustrates an experimental dead-time characteristic diagram of the voltage converter system 80 according to an embodiment of the present invention. FIG. 13B illustrates an experimental dead-time characteristic diagram of a conventional voltage converter as a prior art. Seen in FIG. 13A, when the power supply voltage varies from 5V to 3V, the dead-time of voltage converter 80 rises from 2.64 ns to 4.54 ns. However, in FIG. 13B, when the power supply voltage varies from 5V to 2.7V, the dead-time of the conventional voltage converter rises from 8 ns to 27.8 ns. Compared with the conventional voltage converter, the dead-time of voltage converter 80 performs a much less variation when the power supply voltage drops from a relatively high value (5V) to a relatively low value (3V or 2.7V), which may be considered to be substantially constant.

One with ordinary skill in relevant art should note that the above description is for illustration purpose. It is not intend to limit the utilization of delay circuit 81 to a converter system. On the contrary, in other embodiments, delay circuit may also be utilized in other widely-known structure of system configured to obtain a propagation delay time which is drastically different at different power supply voltage.

Figure 14:
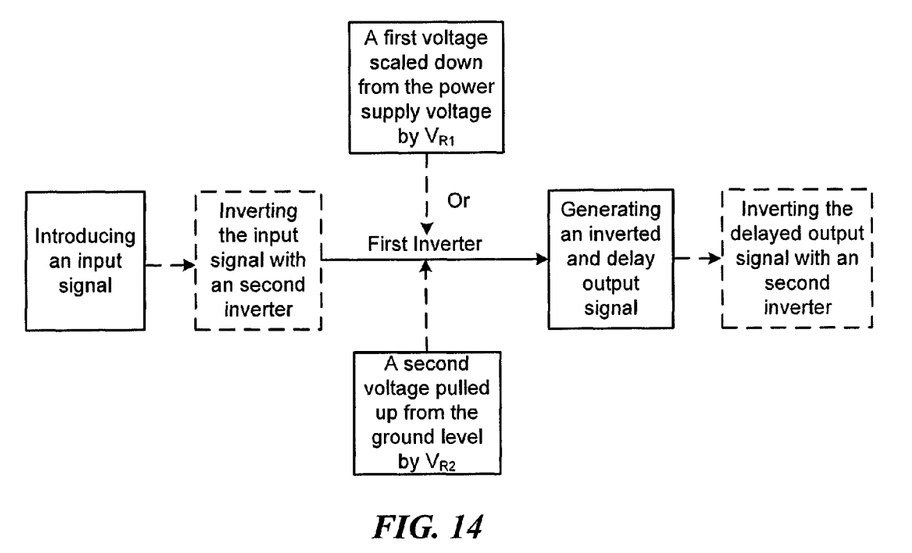
FIG. 14 illustrates a process flow of delaying an input signal according to an embodiment of the present invention.

FIG. 14 illustrates a work flow for delaying an input signal according to an embodiment of the present invention, wherein the delay time of the input signal at a relatively low power supply voltage is much larger than that at a relatively high power supply voltage. As shown in FIG. 14, in the work flow, the input signal is introduced to a first inverter. A first voltage is generated to a power supply end of the first inverter, wherein the first voltage is scaled down by $V_{R1}$ from the power supply voltage $V_{cc}$, configured to prolong the delay time at the falling-edge of the input signal when the power supply voltage is relatively low. In an alternative embodiment, a second voltage is generated to a ground end of the first inverter, wherein the second voltage is pulled up by $V_{R2}$ from the reference ground level, configured to prolong the delay time at the rising-edge of the input signal when the power supply voltage is relatively low. $V_{R2}$ may equal to $V_{R1}$ or not. The input signal is inverted and delayed by the first inverter and an output signal is thus generated. In one embodiment, the output signal may further be inverted by a second inverter. In another embodiment, the input signal may be inverted by a second inverter firstly and then the inverted input signal is introduced to the first inverter.

In certain embodiments, the first inverter is a CMOS inverter, which comprises a PMOS and an NMOS. As mentioned above, in an embodiment, the falling-edge delay time of the input signal may be regulated through changing the gate width of the PMOS. In another embodiment, the rising-edge delay time of the input signal may also be regulated through changing the gate width of the NMOS.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A circuit system, comprising:
a first signal path, comprising a first functional circuitry, wherein the first functional circuitry is powered by a voltage supplied by a power supply, and is configured to receive a first signal, and wherein the first functional circuitry is configured to generate a third signal with a first delay time, wherein the first delay time increases as the voltage supplied by the power supply is decreased;
a second signal path, comprising a delay circuit, wherein the delay circuit is coupled to a second signal and is configured to generate a delayed second signal with a second delay time; and
a second functional circuitry, coupled to the first signal path and the second signal path, configured to generate a fourth signal according to the third signal and the delayed second signal;
wherein the delay circuit comprises:
a first inverter, having an input end, an output end, a power supply end and a ground end, wherein the input end is coupled to the second signal and the wherein the output end provides an output signal of the first inverter;
a first load capacitor, coupled between the output end of the first inverter and a reference ground; and
a first voltage clamping module, coupled between the power supply voltage and the power supply end of the inverter, or coupled between the ground end of the inverter and the reference ground, wherein the first voltage clamping module generates a voltage drop when a current flows through the first voltage clamping module, and wherein the first voltage clamping module is configured to prolong the second delay time as the power supply voltage decreases to make the second signal be synchronous with the first signal;
and wherein:
the second functional circuitry comprises a switch-mode voltage converter, comprising a primary switch and a synchronous rectifier, configured to convert an input voltage to an output voltage;
the first signal comprises a PWM control signal;
the first functional circuit comprises a voltage level shifter circuit, having an input end and an output end, wherein the input end is coupled to the PWM control signal and wherein the output end provides a high side gate signal as the third signal which is coupled to the primary switch; and
the second signal comprises a $\overline{\text{PMW}}$ signal, wherein the $\overline{\text{PMW}}$ signal is a complementary signal of the PWM control signal.

2. The circuit system according to claim 1, wherein:
the first voltage clamping module is a diode-connected P-type MOSFET, wherein the gate and the drain of the MOSFET are coupled to the power supply end of the first inverter, and the source of the MOSFET is coupled to the power supply voltage.

3. The circuit system according to claim 1, wherein:
the first voltage clamping module is a diode-connected N-type MOSFET, wherein the gate and the drain of the N-type MOSFET are coupled to the ground end of the first inverter, and the source of the N-type MOSFET is coupled to the reference ground.

4. The circuit system according to claim 1, wherein the delay circuit comprises one or more delay cell units, wherein a delay cell unit comprises:
the first inverter;
the first load capacitor;
the first voltage clamping module; and
a second inverter;
wherein the second inverter has an input end and an output end, wherein:
the input end of the second inverter is coupled to the output end of the first inverter and wherein the output end of the second inverter provides an output signal of the second inverter; or
the input end of the second inverter is coupled to the second signal path to receive the second signal and wherein the output end of the second inverter is coupled to the input end of the first inverter.

5. The circuit system according to claim 1, wherein the delay circuit comprises one or more delay cell units, wherein a delay cell unit comprises:
the first inverter;
the first load capacitor;
the first voltage clamping module;
a second inverter, having an input end, an output end, a power supply end and a ground end, wherein the input end is coupled to the output end of the first inverter and wherein the output end provides an output signal of the second inverter;
a second load capacitor, coupled between the output end of the second inverter and a reference ground;
a second voltage clamping module, coupled between the power supply voltage and the power supply end of the second inverter if the first voltage clamping module is coupled between the ground end of the first inverter and the reference ground, or coupled between the ground end of the second inverter and the reference ground if the first voltage clamping module is coupled between the power supply voltage and the power supply end of the first inverter, wherein the second voltage clamping module generates a voltage drop when a current flows through the second voltage clamping module, and wherein the second voltage clamping module is configured to prolong the second delay time further as the power supply voltage decreases to make the second signal be synchronous with the first signal.

6. The circuit system according to claim 5, wherein:
the second voltage clamping module is a diode-connected P-type MOSFET if the second voltage clamping module is coupled between the power supply voltage and the power supply end of the second inverter, wherein the gate and the drain of the MOSFET are coupled to the power supply end of the second inverter, and the source of the MOSFET is coupled to the power supply voltage.

7. The circuit system according to claim 5, wherein:
the second voltage clamping module is a diode-connected N-type MOSFET if the second voltage clamping module is coupled between the ground end of the inverter and the reference ground, wherein the gate and the drain of the N-type MOSFET are coupled to the ground end of the second inverter, and the source of the N-type MOSFET is coupled to the reference ground.

8. The circuit system according to claim 1, further comprising:
a third inverter, having an input end and an output end, wherein the input end is coupled to the $\overline{PMW}$ signal; and
an AND gate, having two input ends and an output end, wherein the two input ends are coupled to the PWM control signal and the output end of the third inverter respectively, and wherein the output end is coupled to the input end of the voltage level shifter circuit.

9. The circuit system according to claim 1, wherein the first inverter comprises a CMOS inverter.

\* \* \* \* \*